United States Patent
Hino et al.

(10) Patent No.: US 8,087,748 B2
(45) Date of Patent: Jan. 3, 2012

(54) INK JET RECORDING HEAD, PRODUCING METHOD THEREFOR AND COMPOSITION FOR INK JET RECORDING HEAD

(75) Inventors: Etsuko Hino, Tokyo (JP); Norio Ohkuma, Machida (JP); Yoshikazu Saito, Kawasaki (JP); Mitsutoshi Noguchi, Chigasaki (JP); Helmut Schmidt, Saarbruecken-Guedingen (DE); Carsten Becker-Willinger, Saarbruecken (DE); Pamela Kalmes, Merchweiler (DE)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/017,114

(22) Filed: Jan. 31, 2011

(65) Prior Publication Data
US 2011/0122198 A1 May 26, 2011

Related U.S. Application Data

(62) Division of application No. 12/857,158, filed on Aug. 16, 2010, now Pat. No. 8,012,364, which is a division of application No. 11/813,398, filed as application No. PCT/JP2006/301268 on Jan. 20, 2006, now Pat. No. 7,810,904.

(30) Foreign Application Priority Data

Jan. 21, 2005 (JP) ................... 2005-014746

(51) Int. Cl.
B41J 2/14 (2006.01)
(52) U.S. Cl. ................ 347/45; 347/47; 347/65; 216/27
(58) Field of Classification Search ............ 347/44, 347/45, 65, 47; 216/27
See application file for complete search history.

(56) References Cited

U.S. PATENT DOCUMENTS

| | | | |
|---|---|---|---|
| 5,010,356 A | 4/1991 | Albinson | |
| 5,057,550 A | 10/1991 | Lutz et al. | |
| 5,387,646 A * | 2/1995 | Nakahata et al. | 525/103 |
| 5,478,606 A | 12/1995 | Ohkuma et al. | |
| 5,663,752 A | 9/1997 | Imamura et al. | |
| 6,033,781 A | 3/2000 | Brotzman, Jr. et al. | |
| 6,283,578 B1 * | 9/2001 | Popall et al. | 347/45 |
| 6,312,085 B1 | 11/2001 | Kappel et al. | |
| 6,455,112 B1 | 9/2002 | Ohkuma et al. | |
| 6,713,128 B2 * | 3/2004 | Shimomura et al. | 427/273 |
| 6,869,541 B2 | 3/2005 | Shimomura et al. | |
| 7,055,938 B1 | 6/2006 | Ohkuma et al. | |
| 2003/0185996 A1 | 10/2003 | Shimomura et al. | |
| 2006/0132539 A1 | 6/2006 | Hino et al. | |

(Continued)

FOREIGN PATENT DOCUMENTS

EP 0 431 809 A2 6/1991

(Continued)

*Primary Examiner* — Matthew Luu
*Assistant Examiner* — Rut Patel
(74) *Attorney, Agent, or Firm* — Fitzpatrick, Cella, Harper & Scinto

(57) ABSTRACT

An ink jet recording head having a high durability and high ink resistance can enable high-quality image recording by employing a material capable of reducing the internal stress and having satisfactory patterning characteristics. Such an ink jet recording head can be produced with high precision. A cationically photopolymerizable resin composition containing a condensate of a hydrolysable organosilane compound, employed as a material for forming a flow path forming member, enables a reduction of internal stress and a highly precise pattern in the flow path forming member, thereby providing an ink jet recording head having high durability and high ink resistance and capable of high-quality printing over a prolonged time.

3 Claims, 4 Drawing Sheets

U.S. PATENT DOCUMENTS

| | | |
|---|---|---|
| 2006/0277755 A1 | 12/2006 | Kubota et al. |
| 2007/0085877 A1 | 4/2007 | Ohkuma et al. |
| 2007/0099121 A1 | 5/2007 | Kubota et al. |
| 2008/0018712 A1 | 1/2008 | Saito et al. |

FOREIGN PATENT DOCUMENTS

| | | |
|---|---|---|
| EP | 0 466 025 A2 | 1/1992 |
| EP | 1 038 907 A2 | 9/2000 |
| JP | 6-286149 A | 10/1994 |
| JP | 07-195700 A | 8/1995 |
| JP | 8-290572 A | 11/1996 |
| JP | 9-234874 A | 9/1997 |
| JP | 2003-238770 A | 8/2003 |
| JP | 2005-4052 A | 1/2005 |

* cited by examiner

INK JET RECORDING HEAD, PRODUCING METHOD THEREFOR AND COMPOSITION FOR INK JET RECORDING HEAD

This is a division of U.S. patent application Ser. No. 12/857,158, filed Aug. 16, 2010, which is a divisional of U.S. patent application Ser. No. 11/813,398, filed Jul. 5, 2007, now U.S. Pat. No. 7,810,904, issued Oct. 12, 2010, and which is a national stage application of PCT International Application No. PCT/JP2006/301268, filed Jan. 20, 2006.

TECHNICAL FIELD

The present invention relates to an ink jet recording head utilizing a cured substance of a specified photopolymerizable composition in a liquid flow path forming member, a producing method therefor, and a composition for an ink jet recording head.

BACKGROUND ART

In an ink jet recording method for forming an image by discharging a liquid droplet from a discharge port for deposition on a recording medium represented by paper, technical developments are being continued for improving various performances. Among these, a strong requirement exists for forming a smaller droplet for improving the image quality, and a technology is requested for forming a fine structure constituting an ink flow path or a nozzle with a high precision. For such technology, photolithography is superior in the precision and the simplicity of process, and Japanese Patent Application Laid-Open No. H06-286149 discloses a method of preparing an ink jet recording head by a photolithographic process utilizing a cationic polymerization of a cationic polymerization of an epoxy resin.

A material cured by a cationic polymerization is generally better in the ink resistance in comparison with that obtained by a radical polymerization, and is suitable for use in an ink jet recording head.

On the other hand, for improving the recording head, a larger size of the recording head itself and an increase in a printing width thereof are very effective, and are being investigated in the heads of various types. However a heating process is often employed in the production process, and it is known that a resinous material, employed for preparing a nozzle member, generates a residual stress with an adjacent inorganic material such as a substrate, because of a contraction at curing or a thermal hysteresis. Also in case the nozzle member becomes larger in a thickness or an area, the stress acting on the nozzle pattern becomes larger, often leading to a peeling from the substrate or a crack formation, and a reduction in the stress is therefore a major target.

For reducing the stress in a resin coated film, there are representatively known a method of adding an inorganic material such as a filler thereby reducing a thermal expansion of the resin and a method of adding a material of a high flexibility thereby reducing the elastic modulus of the resin itself. In fact Japanese Patent Application Laid-Open No. H09-234874 discloses a method of employing a filler-containing resin for the nozzle member and molding it by an ablation with an excimer laser. Also EP 0431809 discloses a film coating material in which an organosilane compound is added to an epoxy resin thereby providing flexibility and improving fragility of the resin itself. In a more flexible film, the internal stress itself is estimated to be lower. On the other hand, U.S. Pat. No. 6,312,085 discloses a method of preparing an ink jet head by executing a patterning with a radical photopolymerization and forming/curing a siloxane bond by a heat treatment.

As to the formation of a nozzle member for a recording head capable of achieving an increase in the printing width, Japanese Patent Application Laid-Open No. H09-234874 discloses a method of employing a filler-containing resin as a nozzle member and molding it by an ablation with an excimer laser. Such material, however, may be disadvantageous in productivity and cost, in comparison with an ordinary photolithography utilizing a pattern exposure and a development. Also the material disclosed in EP 0431809 is not intended for a fine structure such as an ink jet recording head, and involves, in patterning process, drawbacks of a thickness loss and a dissolution of the coated film, a pattern deformation and an insufficient resolution. On the other hand, the method disclosed in U.S. Pat. No. 6,312,085 may not provide an alkali resistance because a crosslinked structure is formed by a radical polymerization (methacryloxy group), so that the ink resistance is insufficient in certain types of ink.

DISCLOSURE OF THE INVENTION

The present invention has been made in consideration of the foregoing, and is to provide an ink jet recording head having a high durability and a high ink resistance and enabling a high-quality image recording by employing a material capable of reducing the internal stress and having satisfactory patterning characteristics. The present invention is also to provide a method of producing such ink jet recording head with a high precision, and an ink jet recording head composition for use in such ink jet recording head.

In an embodiment, the present invention provides an ink jet recording head including a substrate provided with an energy-generating element for generating an ink discharging energy, a discharge port provided corresponding to the energy-generating element, an ink flow path for supplying the discharge port with ink, and a flow path forming member which forms the ink flow path in combination with the substrate:

in which the flow path forming member includes a cured substance of a photocurable resin composition containing:
 (a) a cationically polymerizable resin;
 (b) a cationic photopolymerization initiator; and
 (c-1) a condensate containing a bi-functional hydrolysable organosilane compound having an aromatic ring (bi-functional indicating two condensable groups present on a same Si atom) and a tri- or tetra-functional hydrolysable organosilane compound without an aromatic ring.

In another embodiment, the present invention provides an ink jet recording head including a substrate provided with an energy-generating element for generating an ink discharging energy, a discharge port provided corresponding to the energy-generating element, an ink flow path for supplying the discharge port with ink, and a flow path forming member which forms the ink flow path in combination with the substrate:

in which the flow path forming member includes a cured substance of a photocurable resin composition containing:
 (a) a cationically polymerizable resin;
 (b) a cationic photopolymerization initiator; and
 (c-2) a condensate containing a tri-functional hydrolysable organosilane compound having an aromatic ring (tri-functional indicating three condensable groups present on a same Si atom).

The present invention also provides a producing method for such recording heads, and a composition for an ink jet recording head.

The present invention, employing a cationically photopolymerizable resin composition containing a hydrolysable organosilane compound as the material for forming the liquid flow path, allows to reduce an internal stress in the liquid flow path forming member and a highly precise patterning thereof. Thus there can be provided an ink jet recording head having a high durability and a high ink resistance and capable of a high-quality printing over a prolonged period, and a producing method therefor.

BEST MODE FOR CARRYING OUT THE INVENTION

Figure 1A:
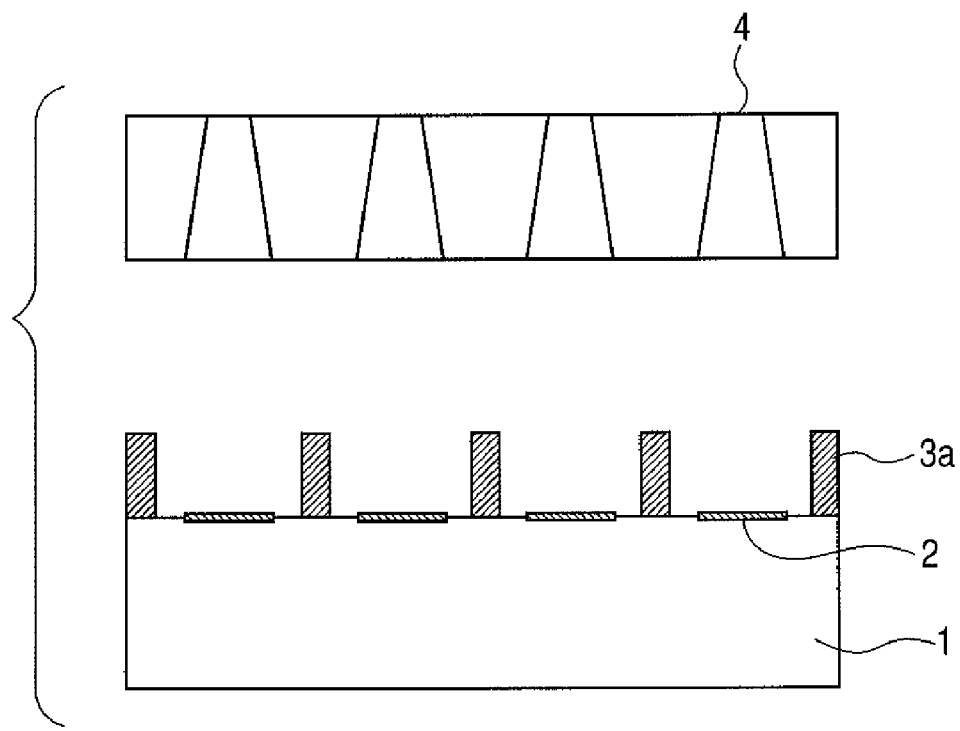
FIG. 1A is a view showing steps in a producing method for an ink jet recording head of the present invention.

The present invention will be clarified in detail in the following.

As a result of intensive studies undertaken by the present inventors, it is found that a reduction in the internal stress and a satisfactory patterning characteristics can be realized at the same time, by employing a photopolymerizable composition of following composition as a material for forming a flow path forming member (also called a nozzle forming material). It is also found that an ink jet recording head of a high ink resistance and a high durability can be prepared with a high precision.

Photopolymerizable Composition A:
(a) a cationically polymerizable resin;
(b) a cationic photopolymerization initiator; and
(c-1) a condensate containing a bi-functional hydrolysable organosilane compound having an aromatic ring (bi-functional indicating two condensable groups present on a same Si atom) and a tri- or higher-functional hydrolysable organosilane compound without an aromatic ring.

Photopolymerizable Composition B:
(a) a cationically polymerizable resin;
(b) a cationic photopolymerization initiator; and
(c-2) a condensate containing a tri-functional hydrolysable organosilane compound having an aromatic ring (number of functional groups indicating number of condensable groups present on a same Si atom).

A cured substance of the aforementioned photopolymerizable composition becomes so-called organic-inorganic hybrid cured substance having a siloxane structure (inorganic structure) present in a condensate of a hydrolysable organosilane compound and also an organic structure formed by a curing reaction utilizing a cationically hydrolysable group. Thus, improvements can be anticipated in the physical properties such as a low thermal expansion and a low stress. Also an ether bond is obtained in case of employing an epoxy group which is a representative cationically polymerizable group.

In fact the organic-inorganic hybrid cured substance of the present invention shows significantly different physical properties in comparison with the prior epoxy resin, with a lowered residual stress of the coated film, thereby providing effects of preventing a deformation of the substrate and improving adhesion to the substrate.

In the present invention, it is important that the hydrolysable organosilane compound having the aromatic ring is bi- or higher-functional and that a tri- or higher-functional hydrolysable organosilane compound is present (namely (c-1) or (c-2)).

It is thus rendered possible to improve a compatibility to the cationically polymerizable resin and the siloxane structure and a film forming property at the coating, thereby attaining a satisfactory patterning property. Also following reactions are considered to take place in a patterning step or in a curing step by light or heat. A bond is considered to be formed between the organic structure formed by the cationically polymerizable resin of the component (a) and the inorganic structure formed by the hydrolysable organosilane compound of the component (c-1) or (c-2). This is because an unreacted cationically polymerizable portion and an unreacted hydrolysable/condensable portion can react by an acid generated by the (b) cationic photopolymerization initiator, as a catalyst.

In general, while an organic structure obtained by a cationic polymerization is excellent in the alkali resistance, a siloxane structure is often inferior in the alkali resistance. In a cured substance in which an organic structure by a cationic polymerization and an inorganic structure by siloxane are co-existent as in the present invention, however, it is surprisingly found that re-hydrolysis of the siloxane structure can be suppressed to improve the alkali resistance and the ink resistance.

In the following, each component to be employed in the present invention will be explained specifically.

A cationically polymerizable resin as the component (a) means a resin including a compound that has a vinyl group or a cyclic ether group. Among these, a compound having an epoxy group or an oxetane group can be employed advantageously. Examples of epoxy resin include a bisphenol-type epoxy resin formed from a monomer or an oligomer having a bisphenol structure such as bisphenol-A diglycidyl ether or bisphenol-F diglycidyl ether, a phenol novolac type epoxy resin, a cresol novolac type epoxy resin, a trisphenolmethane type epoxy resin, and a resin having an alicyclic structure such as 3,4-epoxycyclohexenyl-3',4'-epoxycyclohexene carboxylate.

Also a resin having an epoxy group in a side chain or an alicyclic structure, as shown in the following, can also be employed advantageously.

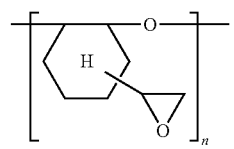

wherein n represents an integer.

Also a novolac resin having a bisphenol-A structure as shown in the following can also be employed advantageously. In the formula, n represents an integer from 1 to 3, particularly n=2.

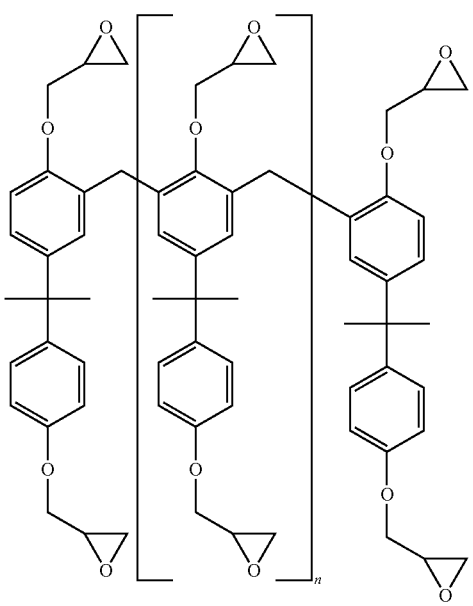

A resin including an oxetane compound can be a resin formed from a phenol novolac type oxetane compound, a cresol novolac type oxetane compound, a trisphenolmethane type oxetane compound, a bisphenol type oxetane compound, or a biphenol type oxetane compound. A combined use of such resin formed from the oxetane compound with the epoxy resin may be advantageous in accelerating the curing reaction.

For satisfactory patterning property, such cationically polymerizable resin is, in a state prior to the polymerization, preferably in a solid state at the room temperature or has a melting point of 40° C. or higher. Also a compound having an epoxy equivalent (or oxetane equivalent) of 2000 or less, preferably 1000 or less, can be employed advantageously. An epoxy equivalent exceeding 2000 reduces a crosslinking density at the curing reaction, thereby leading to a deterioration in Tg or a thermal deformation temperature of the cured substance, or a deterioration in the adhesion to the substrate and the ink resistance.

A cationic photopolymerization initiator as the component (b) can be a compound selected from an onium salt, a borate, a compound having an imide structure, a compound having a triazine structure, an azo compound, and a peroxide. In consideration of sensitivity, stability and reactivity, an aromatic sulfonium salt or an aromatic iodonium salt is preferable. Also various photosensitizers may be employed effectively for improving the sensitivity or adjusting the photosensitive wavelength.

A condensate as the component (c-1) is synthesized from a bi-functional hydrolysable organosilane compound with an aromatic ring and a tri- or higher-functional hydrolysable organosilane compound without an aromatic ring, as the starting materials.

At least a bi-functional hydrolysable organosilane compound with an aromatic ring and at least a tri- or higher-functional hydrolysable organosilane compound without an aromatic ring may be employed as the starting materials.

A blending ratio of the hydrolysable organosilane compound with an aromatic ring and the hydrolysable organosilane compound without an aromatic ring is preferably within a range of (with aromatic ring:without aromatic ring)=1:0.1 to 1:4. In particularly a range of (with aromatic ring:without aromatic ring)=1:0.3 to 1:2 is preferred.

The hydrolysable organosilane compound having an aromatic ring can be a compound represented by a following general formula (1):

$$(R^3)_p\text{—Si—}(OR^2)_q(R^1)_r \quad (1)$$

wherein p+q+r=4 (p being 1 or 2; q being 1, 2 or 3; and r being 0, 1 or 2), $R^1$ and $R^2$ each independently represents a saturated or unsaturated hydrocarbon residue, and $R^3$ represents a non-hydrolysable substituent having an aromatic ring.

More specifically, $R^3$ can be a phenyl group, a naphthyl group or a benzyl group which may be substituted or non-substituted. A substituent on the phenyl, naphthyl or benzyl group can be an alkyl, alkenyl or alkoxy group with 1 to 20 carbon atoms; a hydroxyl group, an epoxy group or a glycidyl group.

$R^2$ can be advantageously a hydrogen atom or an alkyl group with 20 carbon atoms or less, and is particularly advantageously a hydrogen atom, a methyl group, an ethyl group or a propyl group in consideration of reactivity and the like. $R^1$ is preferably a substituted or non-substituted alkyl group with 1 to 30 carbon atoms, and a substituent of such alkyl group can be an alkyl group, an alkenyl group or an alkoxy group with 1 to 20 carbon atoms; a hydroxyl group, an epoxy group or a glycidyl group.

It is found that the patterning property can be significantly improved by utilizing such compound having an aromatic ring. It is estimated that the steric and electronic effects of the aromatic ring influence the reactivity of the condensation reaction and/or the cationic polymerization reaction thereby achieving a control on the skeletal structure of generated resin.

Also the hydrolysable organosilane compound without an aromatic ring can be a compound represented by a following general formula (2):

$$(R^2O)_q\text{—Si—}(R^1)_r \quad (2)$$

wherein q+r=4 (q being 1, 2, 3 or 4; and r being 0, 1, 2 or 3), and $R^1$ and $R^2$ each independently represents a saturated or unsaturated hydrocarbon residue as in the general formula (1).

$R^2$ can be advantageously a hydrogen atom or an alkyl group with 20 carbon atoms or less, and is particularly advantageously a hydrogen atom, a methyl group, an ethyl group or a propyl group in consideration of reactivity and the like. $R^1$ is preferably a substituted or non-substituted alkyl group with 1 to 30 carbon atoms, and a substituent of such alkyl group can be an alkyl group, an alkenyl group or an alkoxy group with 1 to 20 carbon atoms; a hydroxyl group, an epoxy group or a glycidyl group.

In the general formulas (1) and (2), $R^2$ and $R^1$ each independently may have a substituent according to the purpose, and it is effective to introduce a long-chain alkyl group for controlling solubility or a fluorine atom for controlling water absorption. For example introduction of a long-chain alkyl group realizes an improvement in the compatibility to the resin to be mixed and also a further reduction of the stress. It is estimated that the presence of a flexible structure such as a long-chain alkyl group in a side chain improves the mobility of the molecular chain, thereby promoting a stress relaxation in a cooling process. However, with an excessively larger number of carbons, a resulting hydrophobicity inhibits homogeneous hydrolysis/condensation reaction. The alkyl group to be introduced as $R^1$ is preferably an alkyl group with 1 to 30 carbon atoms, and the number of carbon atoms is preferably 3 or more for relaxing the stress, and preferably 20 or less for avoiding an excessive hydrophobicity, more preferably 12 or less.

In the general formulas (1) and (2), it is also very useful to introduce, as the non-hydrolysable group $R^1$, a cationically polymerizable group such as an epoxy group. A cationically polymerizable group introduced in the condensate itself not only improves the compatibility to the cationically polymerizable resin (a) but also an increase in the crosslinking density and an increase in the bonds between resin and condensate. Thus the cationic polymerization reaction further forms a crosslinkage between the organic structure formed by the epoxy resin and the inorganic structure formed by the siloxane group, thereby providing a satisfactory organic-inorganic hybrid material. This is very useful in optimizing patterning characteristics such as a sensitivity and a pattern profile, and in improving a mechanical strength, a durability and an ink resistance. More specifically, $R^1$ can be advantageously a group having a cationically polymerizable group, such as a vinyl group or a cyclic ether group. Examples of the compound of the general formula (2) in which a cationically polymerizable group is introduced in $R^1$ include glycidoxypropyl trimethoxysilane, glycidoxypropyl triethoxysilane, glycidoxypropyl methyldimethoxysilane, glycidoxypropyl methyldiethoxysilane, glycidoxypropyl dimethylmethoxysilane, glycidoxypropyl dimethylethoxysilane, 2-(epoxycyclohexyl)ethyltrimethoxysilane, and 2-(epoxycyclohexyl)ethyltriethoxysilane, but the present invention is naturally not restricted to such examples.

The hydrolysable organosilane compound of the general formula (1) and the hydrolysable organosilane compound of the general formula (2) have a group capable of forming a siloxane bond by a hydrolysis/hydration/condensation reaction by one to four units on one Si atom. In the present invention, a number of the groups capable of forming a siloxane bond on one Si atom is defined as a number of functional groups of such organosilane compound.

In the structure of the present invention, an inorganic structure constructed by the siloxane bond formed by the condensation reaction has a very high importance. A mono-functional silane compound can only become an end of the siloxane structure and cannot construct a polymeric structure. For this reason, in the present invention, the mono-functional silane compound is preferably present by 30 mol. % or less in the raw material silane. On the other hand, a bi-functional silane compound, merely forming a linear structure and incapable of forming a three-dimensionally crosslinked structure, is more flexible than in a three-dimensionally crosslinked structure and effective for stress reduction, but is preferably present by 70 mol. % or less in consideration of the patterning characteristics and the strength and durability of the cured substance as a flow path forming member. Also a tetra-functional silane compound is present by 40 mol. % or less and preferably by 20 mol. % or less, for controlling the siloxane structure and in consideration of the patterning characteristics. Because of the aforementioned reasons, it is important, in order to obtain an optimum composition under control of the physical properties and the patterning characteristics of the coated film (layer), that the hydrolysable organosilane compound with an aromatic ring is two- or higher-functional and that a tri- or higher-functional hydrolysable organosilane compound is present. In case the hydrolysable organosilane compound with an aromatic ring is bi-functional, it is important to employ a tri-functional silane compound, as the hydrolysable organosilane compound without an aromatic ring, in an amount of 20 to 100 mol. %. Therefore an organosilane compound of characteristics capable of attaining the objects of the present invention can be suitably selected.

In the following, there will be explained a condensate including a tri-functional hydrolysable organosilane compound with an aromatic ring, as the component (c-2). Because of the aforementioned reasons, this embodiment also satisfies conditions that the hydrolysable organosilane compound with an aromatic ring is two- or higher-functional and that a tri- or higher-functional hydrolysable organosilane compound is present. The condensate as the component (c-2) can be obtained by condensing at least a tri-functional hydrolysable organosilane compound having an aromatic ring.

In the present invention, a condensation reaction of the hydrolysable organosilane compound can be executed by heating in the presence of water, thereby promoting a hydrolysis and a condensation reaction. A desired degree of condensation can be obtained by suitably controlling the hydrolysis/condensation reaction for example by a temperature, a time and a pH value.

A level of proceeding of the condensation reaction (degree of condensation) can be defined by a proportion of a number of condensed functional groups with respect to a number of condensable functional groups. In practice, it can be estimated from a Si-NMR measurement, and, for a tri-functional organic silane compound, it can be calculated, from a ratio of:

T0: Si atom not bonded to another silane molecule;

T1: Si atom bonded to a silane molecule through oxygen atom;

T2: Si atom bonded to two silane molecules through oxygen atom; and

T3: Si atom bonded to three silane molecules through oxygen atom;

by a following equation:

$$\text{condensation degree } (\%) = \frac{(T1 + 2 \times T2 + 3 \times T3)}{3 \times (T0 + T1 + T2 + T3)} \times 100 \quad (1)$$

Also in case of a bi-functional silane compound, it can be calculated, from a ratio of:

D0: Si atom not bonded to another silane molecule;

D1: Si atom bonded to a silane molecule through oxygen atom; and

D2: Si atom bonded to two silane molecules through oxygen atom;

by a following equation:

$$\text{condensation degree } (\%) = \frac{(D1 + 2 \times D2)}{2 \times (D0 + D1 + D2)} \times 100 \quad (2)$$

The degree of condensation is variable depending on the type of the organosilane compound and synthesis conditions, but an excessively low condensation degree may deteriorate the compatibility to the resin and the coating property. Therefore the condensation degree is preferably 20% or higher and more preferably 30% or higher.

A resolution can be improved by controlling the degree of condensation. In the condensate containing the tri-functional hydrolysable organosilane compound, a summed proportion of T0 and T1 is preferably 50% or less, more preferably 30% or less. Also the proportion of T3 is preferably 15% or higher, more preferably 20% or higher.

The ratio of T0, T1 or T3 is calculated according to the following equation:

$$\text{ratio } TX \ (X = 0, 1, 2, 3) = \frac{TX}{(T0 + T1 + T2 + T3)} \times 100 \quad (3)$$

Also at the hydrolysis reaction, it is possible to control the degree of condensation by utilizing a metal alkoxide as a catalyst for the hydrolysis. The metal alkoxide can be, for example, aluminum alkoxide, titanium alkoxide, zirconium alkoxide or a complex (such as acetylacetone complex) thereof.

A weight mixing ratio of the cationically polymerizable resin of the component (a) and the condensate of the hydrolysable organosilane compound of the component (c-1) or (c-2) is preferably (a)/(c)=0.1 to 10, more preferably 0.3 to 3. The weight mixing ratio within such range allows to achieve a better stress reduction, and even better mechanical characteristics and patterning characteristics.

In the nozzle forming material described above, various additives may be employed in combination, for the purposes of improving the crosslinking density, sensitivity and coating property, preventing a swelling by the ink, providing a flexibility and improving the adhesion with the substrate. For example the above-mentioned cationic photopolymerization initiator can increase the crosslinking density by heating in a presence of a reducing agent. Such reducing agent can be, for example, copper (II) trifluoromethanesulfonate or ascorbic acid. It is also useful, for preventing a swelling or a dimensional change in a nozzle portion by the ink, to add a low-molecular fluorine compound described in Japanese Patent Application Laid-Open No. H08-290572. Also a silane coupling agent or a sulfur-containing compound may be added for further improving the adhesion with the substrate and for improving the coating property. In the following, there will be explained a process for producing the discharge port and the ink flow path with the above-described nozzle forming material. The present invention is advantageously applicable to a method for producing an ink jet recording head in which an ink flow path is formed by at least executing a pattern exposure and a developing process. It is for example applicable to a method, as described in Japanese Patent Application Laid-Open No. H06-286149, for forming a precise nozzle structure by a photolithographic technology, utilizing a photosensitive material in the nozzle portion.

The producing method of the present invention for the ink jet recording head allows to prepare an ink jet recording head by forming, on a substrate having an ink discharge energy generating element, a flow path forming member by a method including:

1) a step of coating an ink flow path forming material of the present invention on the substrate;

2) a step of subjecting the ink flow path forming material to a pattern exposure; and 3) a step of forming the ink flow path by a developing process, and by laminating thereon a substrate provided with an ink discharge port.

Figure 1B:
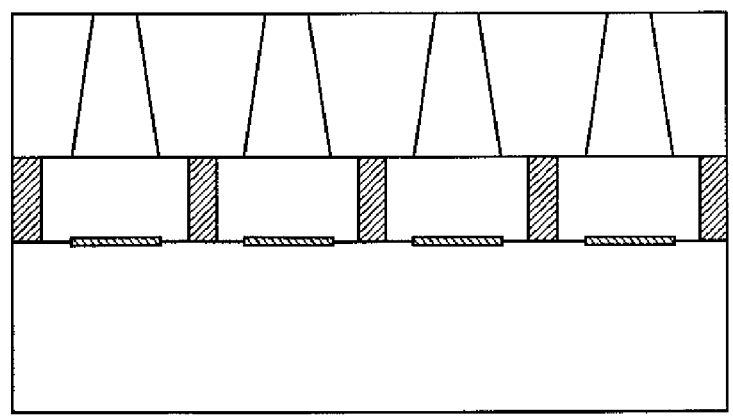
FIG. 1B is a view showing steps in a producing method for an ink jet recording head of the present invention.

In the following, the producing method described above will be explained with reference to schematic views. FIG. 1A shows a substrate 1 bearing an ink discharge energy generating element 2, on which an ink flow path forming member 3a is formed with a photopolymerizable composition of the present invention, and a member having an ink discharge port 4. FIG. 1B shows these members in a laminated state. An adhesive layer may be employed if necessary. Finally a heating process is applied if necessary to completely cure the nozzle forming material and the photosensitive liquid-repellent material to complete the ink jet recording head.

In another embodiment of the present invention, there is provided a producing method for an ink jet recording head including, on a substrate bearing an ink discharge energy generating element:

1) a step of forming an ink flow path pattern as a mold member with a soluble resin;

2) a step of forming a covering resin layer to constitute ink flow path walls with the above-described photopolymerizable composition, in such a position as to cover the soluble resin layer;

3) a step of forming an ink discharge port in the covering resin layer above the ink discharge energy generating element; and 4) a step of dissolving out the soluble resin layer.

Figure 2A:
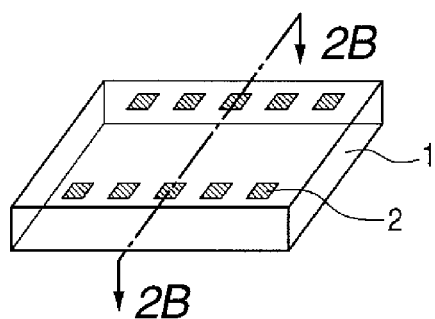
FIGS. 2A, 2B, 2C, 2D, 2E, 2F, 2G and 2H are views showing steps in a producing method for an ink jet recording head of the present invention.
Figure 2E:
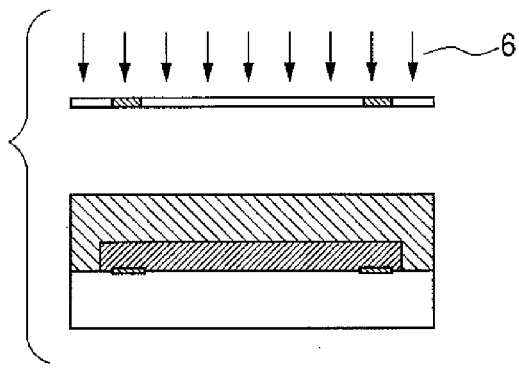
Figure 2B:
Figure 2F:
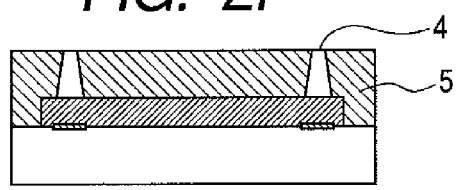
Figure 2C:
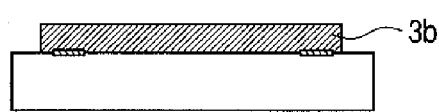
Figure 2G:
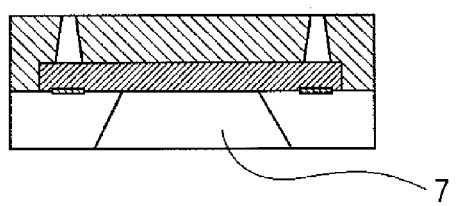
Figure 2D:
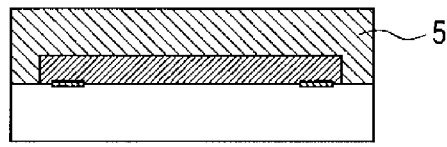
Figure 2H:
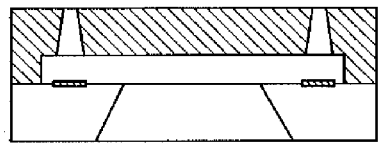

In the following, the producing method utilizing the above-mentioned mold member will be explained with reference to schematic views. FIG. 2A is a perspective view of a substrate 1 on which an ink discharge energy generating element 2 is formed. FIG. 2B is a cross sectional view along a line B-B' in FIG. 2A. FIG. 2C is a view showing the substrate 1 on which an ink flow path pattern 3b as a mold member is formed with a soluble resin. The ink flow path pattern 3b is preferably formed with a positive photoresist, and particularly preferably with a photodecomposable positive photoresist of a relatively high molecular weight in order to prevent a profile destruction in laminating the nozzle forming material in a later step. Then FIG. 2D shows a state where a photocurable resin layer 5 is provided on the ink flow path pattern 3b. The photocurable resin layer 5 has ability to polymerize by an optical or thermal energy, and the photopolymerizable composition explained in the foregoing is utilized for this purpose. The photocurable resin layer 5 can be formed by spin coating or slit coating, utilizing the photopolymerizable composition, diluted with a solvent according to the necessity. Then, as shown in FIG. 2E, a pattern exposure is executed through a mask and a developing process is executed to form a discharge port 4 in a predetermined position of the photocurable resin layer 5 as shown in FIG. 2F. Then an ink supply port 7 is suitably formed in the substrate 1 (FIG. 2G), and the ink flow path pattern 3b is dissolved out (FIG. 2H). Finally, if necessary, a heating process is executed to completely cure the photocurable resin layer thereby completing the ink jet recording head.

In case of employing the nozzle forming material of the present invention for the photocurable resin layer, the coating operation may be executed plural times in order to obtain a desired coating thickness. The nozzle forming material of the present invention includes reactive groups, namely a photosensitive group and a hydrolysable group. These reactive groups still remain even after the pattern exposure and the developing process, and can be cured by additional heat or by light. As a result, adhesion to the substrate and durability to the ink and to a wiping operation can be further improved advantageously.

Also according to the present invention, producing methods schematically shown in FIGS. 3A to 3D and FIGS. 4A to 4E are provided.

Figure 3A:
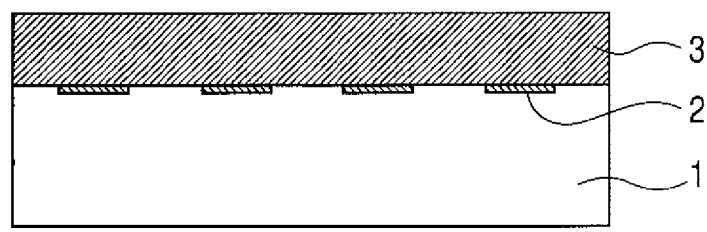
FIGS. 3A, 3B, 3C and 3D are views showing steps in another producing method for an ink jet recording head of the present invention.
Figure 3B:
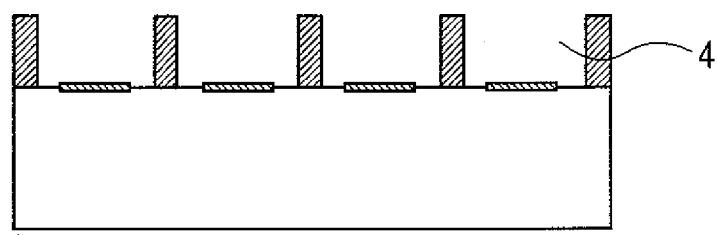
Figure 3C:
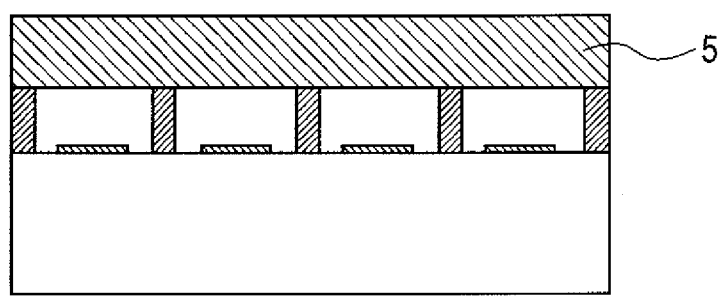
Figure 3D:
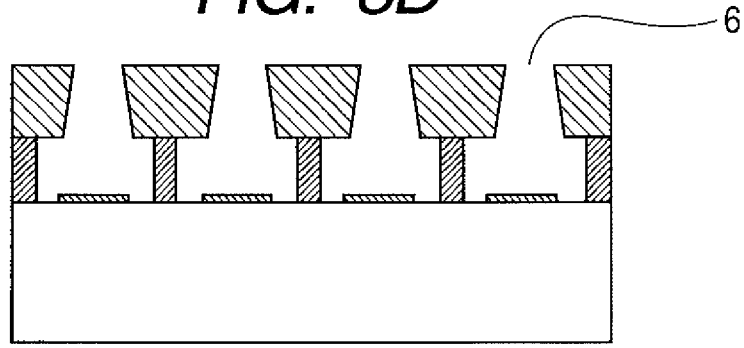

FIG. 3A shows a step of forming, on a substrate 1 bearing an ink discharge energy generating element 2, a layer (1) of the photopolymerizable resin of the present invention. FIG. 3B shows a state where an ink flow path pattern is formed by applying a pattern exposure and a developing process. FIG. 3C shows a state where a photopolymerizable resin layer 2 is laminated thereon. At the lamination, it is also possible, if necessary, to provide an adhesive layer or to utilize a supporting film on the resin layer. FIG. 3D shows a state where, by applying an exposure of a pattern of a discharge port and a developing process on the photopolymerizable resin layer 2, an ink discharge port is formed. Finally a heating process is applied if necessary to completely cure the nozzle forming material and the photosensitive liquid-repellent material to complete the ink jet recording head.

Figure 4A:
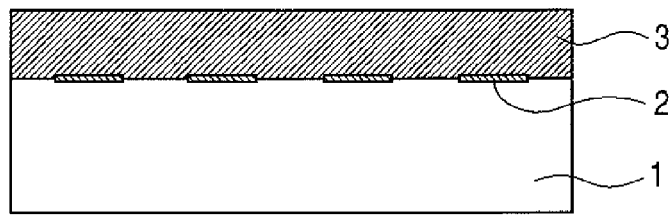
FIGS. 4A, 4B, 4C, 4D and 4E are views showing steps in another producing method for an ink jet recording head of the present invention.
Figure 4B:
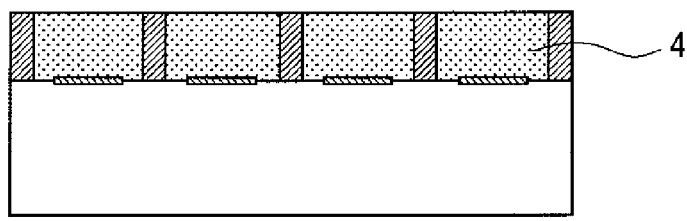
Figure 4C:
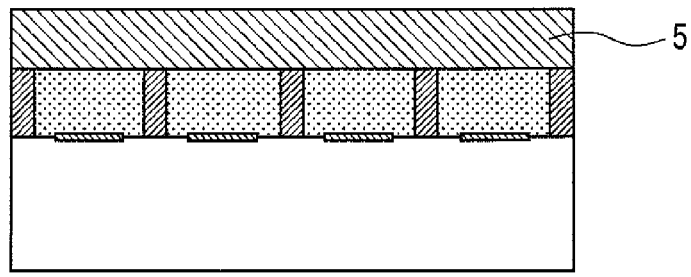
Figure 4D:
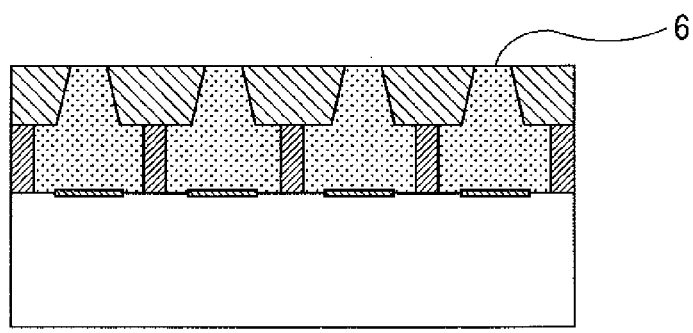
Figure 4E:
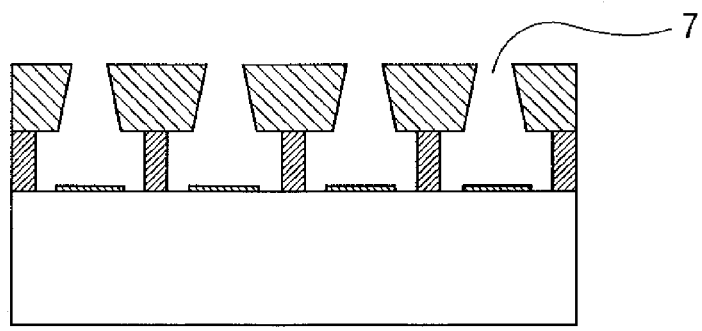

FIG. 4A shows a step of forming, on a substrate 1 bearing an ink discharge energy generating element 2, a layer (1) of the photopolymerizable resin of the present invention. FIG. 4B shows a state where a pattern exposure is applied thereon to form a latent image of an ink flow path pattern. FIG. 4C shows a state where a photopolymerizable resin layer 2 is laminated thereon. At the lamination, it is also possible, if necessary, to provide an adhesive layer or to utilize a supporting film on the resin layer. FIG. 4D shows a state where an exposure of a pattern of a discharge port is applied to form a latent image of the ink discharge port. FIG. 4E shows a state where the ink discharge port and the ink flow path pattern are formed by a developing process. Finally a heating process is applied if necessary to completely cure the nozzle forming material and the photosensitive liquid-repellent material to complete the ink jet recording head.

A composition for the ink jet recording head of the present invention can be advantageously utilized in the producing methods as described above, and such producing methods allow to obtain an ink jet recording head having a high durability and a high ink resistance and capable of a high-quality image recording.

EXAMPLES

In the following, the present invention will be clarified further by examples thereof.

Synthesis Example 1

A hydrolysable condensate was synthesized by a following process. With hydrochloric acid as a catalyst, 55.6 g (0.2 mol) of glycidoxypropyl triethoxysilane, 48.1 g (0.2 mol) of phenyl triethoxysilane and 21.6 g of water were stirred at the room temperature and then refluxed under heating for 24 hours to obtain a solution of a hydrolysable condensate. The degree of condensation of silane, measured by $^{29}$Si-NMR, was about 69%.

Example 1

The compound of Synthesis Example 1 was used for preparing a composition shown in Table 1, thereby obtaining a coating solution.

TABLE 1

| | (coating composition) | |
|---|---|---|
| hydrolysable condensate | hydrolysable condensate solution of Synthetic Example 1 | 230 parts by weight |
| epoxy resin | EHPE-3150 (Daicel Chemical) | 100 parts by weight |
| cationic photopolymerization initiator | SP172 (Asahi Denka) | 5 parts by weight |
| reducing agent | copper (II) trifluoromethane-sulfonate | 0.5 parts by weight |
| solvent | ethanol | 10 parts by weight |

The coating solution of the above-mentioned composition was spin coated on a silicon substrate to form a coated layer, which was prebaked for 4 minutes at 90° C. A thickness of the coated film was 20 μm. Then it was exposed with a Canon mask aligner (MPA600 Super), then heated for 4 minutes at 90° C., developed with methyl isobutyl ketone and rinsed with isopropyl alcohol to form an evaluation pattern. Thereafter it was heated for 1 hour at 200° C. to obtain a cured substance.

Examples 2 to 11 and Comparative Examples 1 to 5

Hydrolysable condensates shown in Table 2 were synthesized in the same manner as in Example 1. Also compositions as shown in Table 1 were prepared in the same manner as in Example 1, and subjected to coating, exposure and development to obtain cured substances.

TABLE 2

| | organosilane compound 1 | organosilane compound 2 | organosilane compound 3 | mixing ratio (mol %) |
|---|---|---|---|---|
| Example 2 | HexylTES | PhTES | — | 50/50 |
| Example 3 | GPTES | HexylTES | PhTES | 10/40/50 |
| Example 4 | ECETES | PhTES | — | 50/50 |
| Example 5 | GPTES | DPhDES | — | 50/50 |
| Example 6 | PhTES | — | — | 100 |
| Example 7 | PhTES | DPhDES | — | 50/50 |
| Example 8 | GPTES | HexylTES | PhTES | 20/30/50 |
| Example 9 | GPTES | DMDEOS | PhTES | 20/30/50 |
| Example 10 | DMDEOS | PhTES | — | 50/50 |
| Example 11 | HexylTES | DPhDES | — | 50/50 |
| Comp. Ex. 1 | GPTES | — | — | 100 |
| Comp. Ex. 2 | GPTES | DMDEOS | — | 50/50 |
| Comp. Ex. 3 | GPTES | HexylTES | — | 50/50 |
| Comp. Ex. 4 | DPhDES | — | — | 100 |
| Comp. Ex. 5 | DMDEOS | DPhDES | — | 50/50 | wherein:

GPTES: glycidoxypropyl triethoxysilane

PhTES: phenyl triethoxysilane

DMDEOS: dimethyldiethoxysilane

HexylTES: hexyl triethoxysilane

ECETES: epoxycyclohexylethyl triethoxysilane

DPhDES: diphenyldiethoxysilane

Comparative Example 6

A composition obtained by eliminating the hydrolysable condensates from that shown in Table 1 was used to prepare a coated film in the same manner, thereby obtaining a cured substance.

<Stress Measurement>

The coated films of Examples 1 to 11 and Comparative Examples 1 to 6 were subjected to a stress measurement with a thin film property measuring apparatus FLX-2320 to obtain results shown in Table 3, which confirmed that the composition of the present invention could reduce the stress in the coated film after curing.

<Evaluation of Resolution>

A resolution of each composition was evaluated utilizing a line-and-space mask of 2 to 20 μm. Also a ratio of T0, T1 and T3 structures was measured with Si-NMR. Results shown in Table 3 were obtained to confirm that the composition of the present invention could provide a satisfactory resolution.

TABLE 3

| | hydrolysable condensates | | | stress after curing (MPa) | resolution (μm) | T0 + T1 (%) | T3 (%) |
|---|---|---|---|---|---|---|---|
| Example 1 | GPTES | PhTES | — | 26 | 6 | 13 | 25 |
| Example 2 | HexyITES | PhTES | — | 22 | 6 | 12 | 34 |
| Example 3 | GPTES | HexyITES | PhTES | 19 | 6 | 18 | 27 |
| Example 4 | ECETES | PhTES | — | 27 | 6 | 21 | 25 |
| Example 5 | GPTES | DPhDES | — | 20 | 10 | 32 | 20 |
| Example 6 | PhTES | — | — | 27 | 6 | 22 | 26 |
| Example 7 | PhTES | DPhDES | — | 23 | 8 | 30 | 20 |
| Example 8 | GPTES | HexyITES | PhTES | 21 | 10 | 27 | 18 |
| Example 9 | GPTES | DMDEOS | PhTES | 23 | 10 | 42 | 26 |
| Example 10 | DMDEOS | PhTES | — | 22 | 12 | 50 | 15 |
| Example 11 | HexyITES | DPhDES | — | 19 | 10 | 26 | 23 |
| Comp. Ex. 1 | GPTES | — | — | 24 | 20< | — | — |
| Comp. Ex. 2 | GPTES | DMDEOS | — | 23 | 20< | — | — |
| Comp. Ex. 3 | GPTES | HexyITES | — | 23 | 20< | — | — |
| Comp. Ex. 4 | DPhDES | — | — | 18 | 20< | — | — |
| Comp. Ex. 5 | DMDEOS | DPhDES | — | 19 | 20< | — | — |
| Comp. Ex. 6 | none | none | none | 32 | 6 | — | — |

Example 12

An ink jet recording head was prepared with the composition of Example 1 according to the procedure shown in FIGS. 2A to 2H. At first, on a silicon substrate on which electric-heat conversion elements were formed as ink discharge energy generating elements, polymethyl isopropenyl ketone (ODUR-1010, manufactured by TOKYO OHKA KOGYO Co.) was spin coated as a soluble resin layer. It was then prebaked for 6 minutes at 120° C. and subjected to a pattern exposure with a mask aligner UX3000 manufactured by Ushio Inc. The exposure was executed for 3 minutes, and development was executed with methyl isobutyl ketone/xylene=2/1 followed by rinsing with xylene. Polymethyl isopropenyl ketone is so-called positive resist which is decomposed by a UV irradiation and becomes soluble in an organic solvent. The pattern of such soluble'resin is formed in a non-exposed portion at the pattern exposure, for securing an ink supplying flow path (FIG. 2C). The soluble resin had a thickness of 20 μm after the development.

Then a photocurable resin layer of a composition of Example 1 was spin coated on the ink flow path pattern formed by the soluble resin layer, and was prebaked for 4 minutes at 90° C. The coating and the prebake were repeated three times, to obtain a photocurable resin layer with a final thickness of 55 μm on the ink flow path pattern (FIG. 2D). Then a pattern exposure for the ink discharge port was executed with a Canon mask aligner MPA600 Super (FIG. 2E). Then heating was conducted for 4 minutes at 90° C., and the discharge port pattern was prepared by a development with methyl isobutyl ketone (MIBK) and a rinsing with isopropyl alcohol. A discharge port pattern having a sharp pattern edge was obtained in this manner (FIG. 2F). Then a mask for forming an ink supply port was placed on the backside of the substrate, and an ink supply port was formed by an anisotropic etching of the silicon substrate (FIG. 2G). During the anisotropic etching of silicon, the surface of the substrate having the formed nozzle is protected by a rubber-based protective film.

After the anisotropic etching, the rubber-based protective film was removed, and a flush UV irradiation was executed over the entire surface with UX3000 to decompose the soluble resin constituting the ink flow path pattern. Then the substrate was immersed in methyl lactate under an ultrasonic application to dissolve out the ink flow path pattern, and was then heated for 1 hour at 200° C. to completely cure the photocurable resin layer (FIG. 2H). Finally the ink jet recording head was completed by adhering an ink supply member to the ink supply port.

<Evaluation of Print Quality>

Thus obtained ink jet recording head was filled with a black ink BCI-3eBk manufactured by Canon Inc., and was used to execute a printing operation. As a result, there was obtained an image of a high quality.

<Evaluation of Storability>

When the ink jet recording head, after a storage for 2 months in the ink-filled state, was subjected to a printing operation, print quality same as that prior to the storage test could be obtained.

This application claims priority from Japanese Patent Application No. 2005-014746 filed on Jan. 21, 2005, which is hereby incorporated by reference herein.

The invention claimed is:

1. An ink jet recording head comprising:
   a substrate provided with an energy-generating element for generating energy for discharging liquid;
   a discharge port provided corresponding to the energy-generating element;
   a flow path wall forming member which forms, in combination with the substrate, a path for supplying the discharge port with liquid,
   wherein the flow path wall forming member includes a cured substance of a photocurable resin composition containing:
   (a) a cationically polymerizable resin,
   (b) a cationic photopolymerization initiator, and
   (c) a condensate containing a tri-functional hydrolysable organosilane compound having an aromatic ring (tri-functional indicating a number of condensable groups present on one Si atom) and a hydrolysable organosilane compound without an aromatic ring, and
   wherein the hydrolysable organosilane compound without an aromatic ring has a group capable of a cationic polymerization.

2. An ink jet recording head as claimed in claim 1, wherein the hydrolysable organosilane compound without an aromatic ring includes a bi-functional hydrolysable organosilane compound.

3. An ink jet recording head as claimed in claim 1, wherein the hydrolysable organosilane compound without an aromatic ring includes a hydrolysable organosilane compound having two methyl groups.

* * * * *